United States Patent
Lee

(10) Patent No.: US 10,644,685 B1
(45) Date of Patent: May 5, 2020

(54) SIGNAL RECEIVING CIRCUIT, AND SEMICONDUCTOR APPARATUS AND SEMICONDUCTOR SYSTEM USING THE SIGNAL RECEIVING CIRCUIT

(71) Applicant: SK hynix Inc., Icheon-si, Gyeonggi-do (KR)

(72) Inventor: Hyun Bae Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/448,404

(22) Filed: Jun. 21, 2019

(30) Foreign Application Priority Data

Nov. 8, 2018 (KR) .................. 10-2018-0136565

(51) Int. Cl.
*H04L 25/03* (2006.01)
*H03K 5/135* (2006.01)

(52) U.S. Cl.
CPC ....... *H03K 5/135* (2013.01); *H04L 25/03885* (2013.01)

(58) Field of Classification Search
CPC .......... H03K 5/13; H03K 5/131; H03K 5/135; H03K 5/15; H03K 5/15073; H03K 5/151; H04L 25/03; H04L 25/03006; H04L 25/03076; H04L 25/03878; H04L 25/03885

See application file for complete search history.

(56) References Cited

U.S. PATENT DOCUMENTS

| | | | |
|---|---|---|---|
| 6,532,122 B1* | 3/2003 | Sugawara | G11B 20/10009 360/40 |
| 8,928,371 B2 | 1/2015 | Song | |
| 8,964,826 B2 | 2/2015 | Agrawal et al. | |
| 2002/0008928 A1* | 1/2002 | Takahashi | G11B 20/10203 360/53 |
| 2004/0246034 A1* | 12/2004 | Daishin | G11B 20/10009 327/165 |
| 2008/0056344 A1* | 3/2008 | Hidaka | H04L 25/03885 375/232 |
| 2018/0069690 A1* | 3/2018 | Chattopadhyay | H04L 7/0025 |

* cited by examiner

*Primary Examiner* — Siu M Lee
(74) *Attorney, Agent, or Firm* — William Park & Associates Ltd.

(57) ABSTRACT

A signal receiving circuit includes a buffer, a sampling circuit, and an equalizer. The buffer generates first and second amplified signals by amplifying a currently-inputted received signal in synchronization with an amplification clock signal. The sampling circuit generates an output signal by sampling the first and second amplified signals in synchronization with a sampling clock signal. The equalizer changes voltage levels of the first and second amplified signals based on third and fourth amplified signals which are generated from a previously-inputted received signal in synchronization with the amplification clock signal.

20 Claims, 8 Drawing Sheets

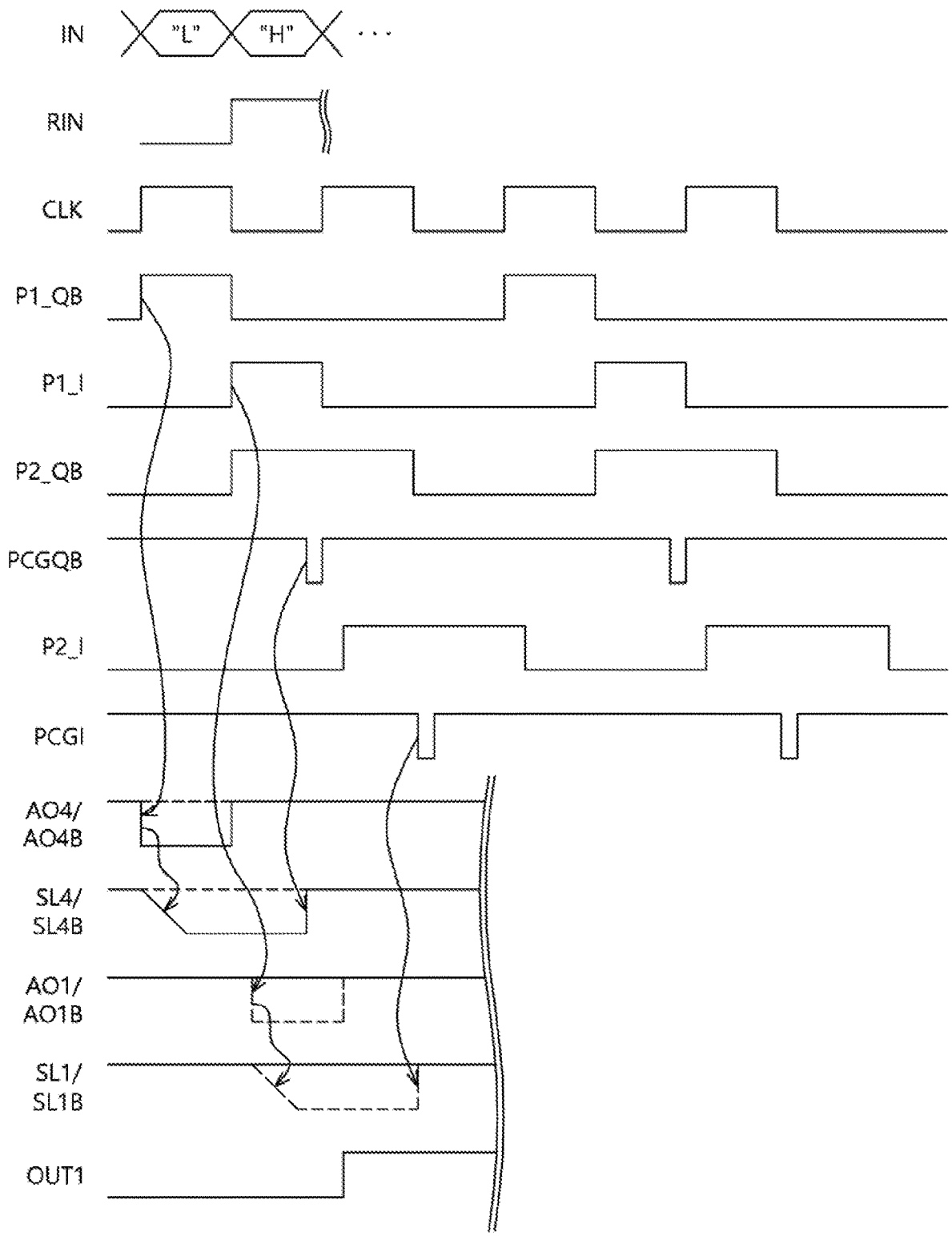

US 10,644,685 B1

SIGNAL RECEIVING CIRCUIT, AND SEMICONDUCTOR APPARATUS AND SEMICONDUCTOR SYSTEM USING THE SIGNAL RECEIVING CIRCUIT

CROSS-REFERENCES TO RELATED APPLICATION

The present application claims priority under 35 U.S.C. § 119(a) to Korean application number 10-2018-0136565, filed on Nov. 8, 2018, in the Korean Intellectual Property Office, which is incorporated herein by reference in its entirety.

BACKGROUND

1. Technical Field

Various embodiments generally relate to integrated circuit technology, and more particularly, to a semiconductor apparatus and a semiconductor system.

2. Related Art

Electronic devices may include many electronic components. Among electronic devices, a computer system may include a large number of semiconductor apparatuses composed of semiconductors. These semiconductor apparatuses may communicate with one another while transmitting and receiving clocks and data. With an increase in operating speed of the computer system, the operating speed of the semiconductor apparatuses also increases. For example, the frequency of a clock signal increases in order to perform data communication between semiconductor apparatuses at high speed.

The semiconductor apparatuses may transmit data to an external device in synchronization with a clock signal or may receive data transmitted from the external device in synchronization with the clock signal. With the increase in frequency of the clock signal, a time margin required for transmitting and receiving data is reduced. Furthermore, the eye or valid window of the transmitted or received data is decreased in proportion to the reduced margin. The semiconductor apparatuses may be coupled to an external device through a signal transmitting line. When a signal is transmitted through the signal transmitting line, signal integrity may be reduced by reflection which occurs in the signal transmitting line. A decision feedback equalizer may be generally used to increase the eye or valid window of a signal by compensating for a post-cursor component caused by the reflection.

SUMMARY

In an embodiment, a signal receiving circuit may include a buffer, a sampling circuit, and an equalizer. The buffer may be configured to generate a first amplified signal and a second amplified signal by amplifying a currently-inputted received signal in synchronization with an amplification clock signal. The sampling circuit may be configured to generate an output signal by sampling the first and second amplified signals in synchronization with a sampling clock signal. The equalizer may be configured to change voltage levels of the first and second amplified signals based on a third amplified signal and a fourth amplified signal which are generated from a previously-inputted received signal in synchronization with the amplification clock signal.

In an embodiment, a signal receiving circuit may include a first buffer, a second buffer, a first equalizer, and a first sampling circuit. The first buffer may be configured to generate a first amplified signal and a second amplified signal by amplifying a received signal in synchronization with a first amplification clock signal. The second buffer may be configured to generate a third amplified signal and a fourth amplified signal by amplifying the received signal in synchronization with a second amplification clock signal. The first equalizer may be configured to change voltage levels of the first and second amplified signals based on the third and fourth amplified signals in synchronization with the first amplification clock signal. The first sampling circuit may be configured to generate a first output signal by sampling the first and second amplified signals in synchronization with a first sampling clock signal.

BRIEF DESCRIPTION OF THE DRAWINGS

FIG. 8 is a timing diagram illustrating an operation of the signal receiving circuit, in accordance with an embodiment.

DETAILED DESCRIPTION

Figure 1:
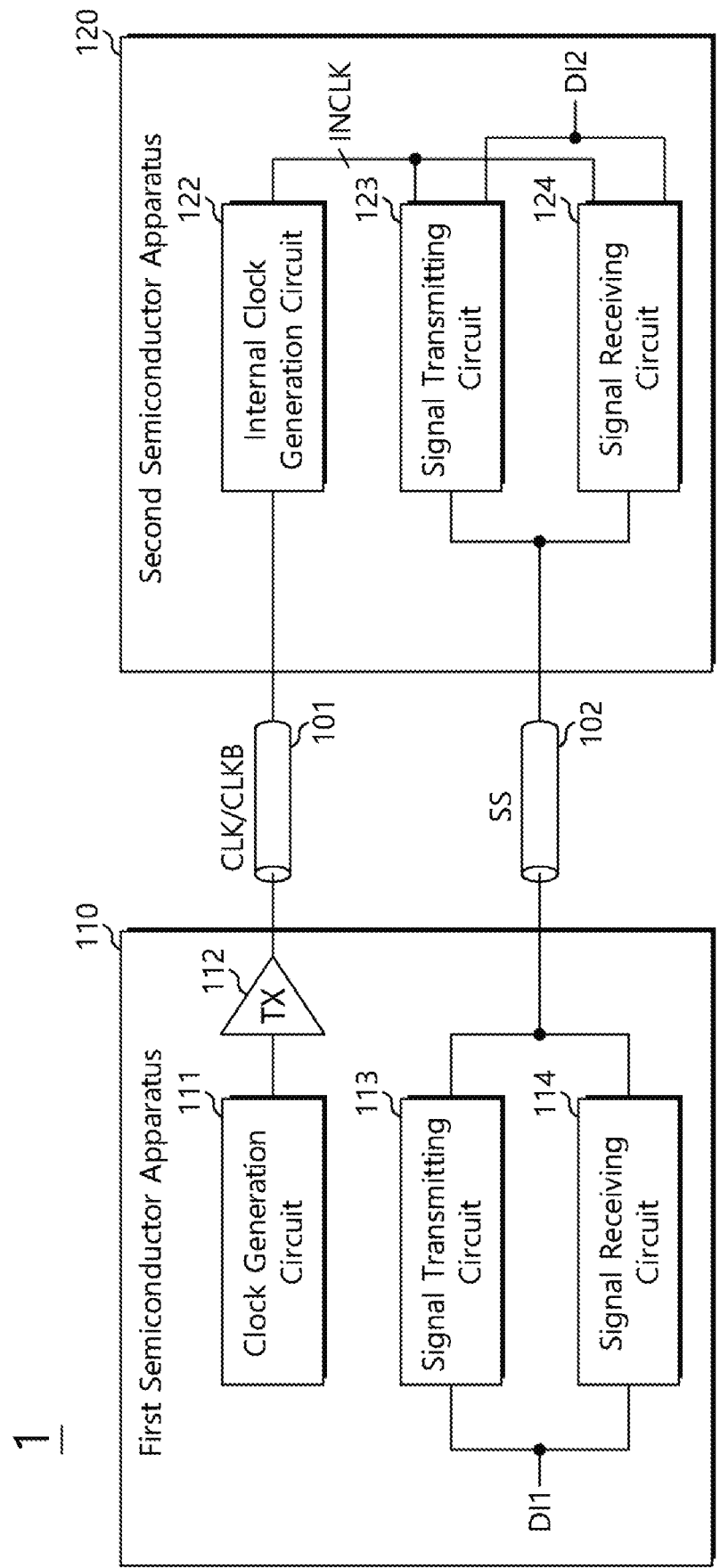
FIG. 1 is a block diagram illustrating a configuration of a semiconductor system, in accordance with an embodiment.

FIG. 1 illustrates a configuration of a semiconductor system 1, in accordance with an embodiment. In FIG. 1, the semiconductor system 1 may include a first semiconductor apparatus 110 and a second semiconductor apparatus 120. The first semiconductor apparatus 110 may provide various control signals used for operating the second semiconductor apparatus 120. The first semiconductor apparatus 110 may include various types of host devices. For example, the first semiconductor apparatus 110 may be a host device such as a central processing unit (CPU), graphic processing unit (GPU), multi-media processor (MMP), digital signal processor, application processor (AP), or memory controller. The second semiconductor apparatus 120 may be a memory device, for example, and the memory device may include a volatile memory and a nonvolatile memory. Examples of the volatile memory may include an SRAM (Static RAM), DRAM (Dynamic RAM) and SDRAM (Synchronous DRAM. The nonvolatile memory may include a ROM (Read Only Memory), PROM (Programmable ROM), EEPROM (Electrically Erasable and Programmable ROM), EPROM (Electrically Programmable ROM), flash memory, PRAM (Phase change RAM), MRAM (Magnetic RAM), RRAM (Resistive RAM), FRAM (Ferroelectric RAM), and the like.

The second semiconductor apparatus 120 may be coupled to the first semiconductor apparatus 110 through a plurality of buses. The plurality of buses may be signal transmission paths, links, or channels for transmitting a signal. The plurality of buses may include a clock bus, a data bus, a command address bus, and the like. The clock bus and the command address bus may be one-way buses, and the data bus may be a two-way bus. In FIG. 1, the second semiconductor apparatus 120 may be coupled to the first semiconductor apparatus 110 through a clock bus 101. The first semiconductor apparatus 110 may transmit a system clock signal CLK to the semiconductor apparatus 120 through the clock bus 101, and the semiconductor apparatus 120 may receive the system clock signal CLK through the clock bus 101. The system clock signal CLK may be transmitted as a differential signal with a complementary signal CLKB.

The second semiconductor apparatus 120 may be coupled to the first semiconductor apparatus 110 through one or more signal buses 102. The first semiconductor apparatus 110 may transmit a synchronization signal SS to the second semiconductor apparatus 120 or receive the synchronization signal SS transmitted from the second semiconductor apparatus 120, through the signal bus 102. The second semiconductor apparatus 120 may receive the synchronization signal SS transmitted from the first semiconductor apparatus 110 through the signal bus 102, or transmit the synchronization signal SS to the first semiconductor apparatus 110. The first and second semiconductor apparatuses 110 and 120 may transmit and receive the synchronization signal SS in synchronization with the system clock signal CLK. The synchronization signal SS may include any types of signals which are transmitted and received in synchronization with the system clock signal CLK. For example, the synchronization signal SS may be data.

The first semiconductor apparatus 110 may include a clock generation circuit 111, a clock transmitter 112, a signal transmitting circuit 113, and a signal receiving circuit 114. The clock generation circuit 111 may generate the system clock signal CLK. The clock generation circuit 111 may include a clock generator, such as a phase locked loop circuit, for example. The clock generation circuit 111 may generate a plurality of clock signals having different phases, and output all or some of the plurality of clock signals as the system clock signal CLK. The clock transmitter 112 may drive the clock bus 101 based on the system clock signal CLK generated by the clock generation circuit 111. The clock transmitter 112 may drive the clock bus 101 to transmit the system clock signal CLK to the second semiconductor apparatus 120.

The signal transmitting circuit 113 may be coupled to the signal bus 102, and may drive the signal bus 102 based on an internal signal DI1 of the first semiconductor apparatus 110. The signal transmitting circuit 113 may drive the signal bus 102 to transmit the internal signal DI1 as the synchronization signal SS to the second semiconductor apparatus 120. The signal receiving circuit 114 may be coupled to the signal bus 102, receive the synchronization signal SS transmitted through the signal bus 102, and generate the internal signal DI1.

The second semiconductor apparatus 120 may include an internal clock generation circuit 122, a signal transmitting circuit 123, and a signal receiving circuit 124. The internal clock generation circuit 122 may be coupled to the clock bus 101, and may receive the system clock signal CLK transmitted through the clock bus 101. The internal clock generation circuit 122 may receive the system clock signal CLK and generate a plurality of internal clock signals INCLK. The internal clock generation circuit 122 may generate the variety of internal clock signals INCLK which can be used in the second semiconductor apparatus 120, and the plurality of internal clock signals INCLK may have different pulse widths and different phases.

The signal transmitting circuit 123 may be coupled to the signal bus 102, and may drive the signal bus 102 based on an internal signal DI2 of the second semiconductor apparatus 120. The signal transmitting circuit 123 may drive the signal bus 102 to transmit the internal signal DI2 as the synchronization signal SS to the first semiconductor apparatus 110. The signal transmitting circuit 123 may further receive one or more of the plurality of internal clock signals INCLK. The signal transmitting circuit 123 may transmit the synchronization signal SS to the first semiconductor apparatus 110 in synchronization with the internal clock signals INCLK. The signal receiving circuit 124 may be coupled to the signal bus 102, receive the synchronization signal SS transmitted through the signal bus 102, and generate the internal signal DI2. The signal receiving circuit 124 may further receive the internal clock signal INCLK. The signal receiving circuit 124 may generate the internal signal DI2 from the synchronization signal SS based on the internal clock signal INCLK. The signal receiving circuit 124 may generate the internal signal DI2 from the synchronization signal SS based on two or more internal clock signals INCLK having different pulse widths and different phases.

Figure 2:
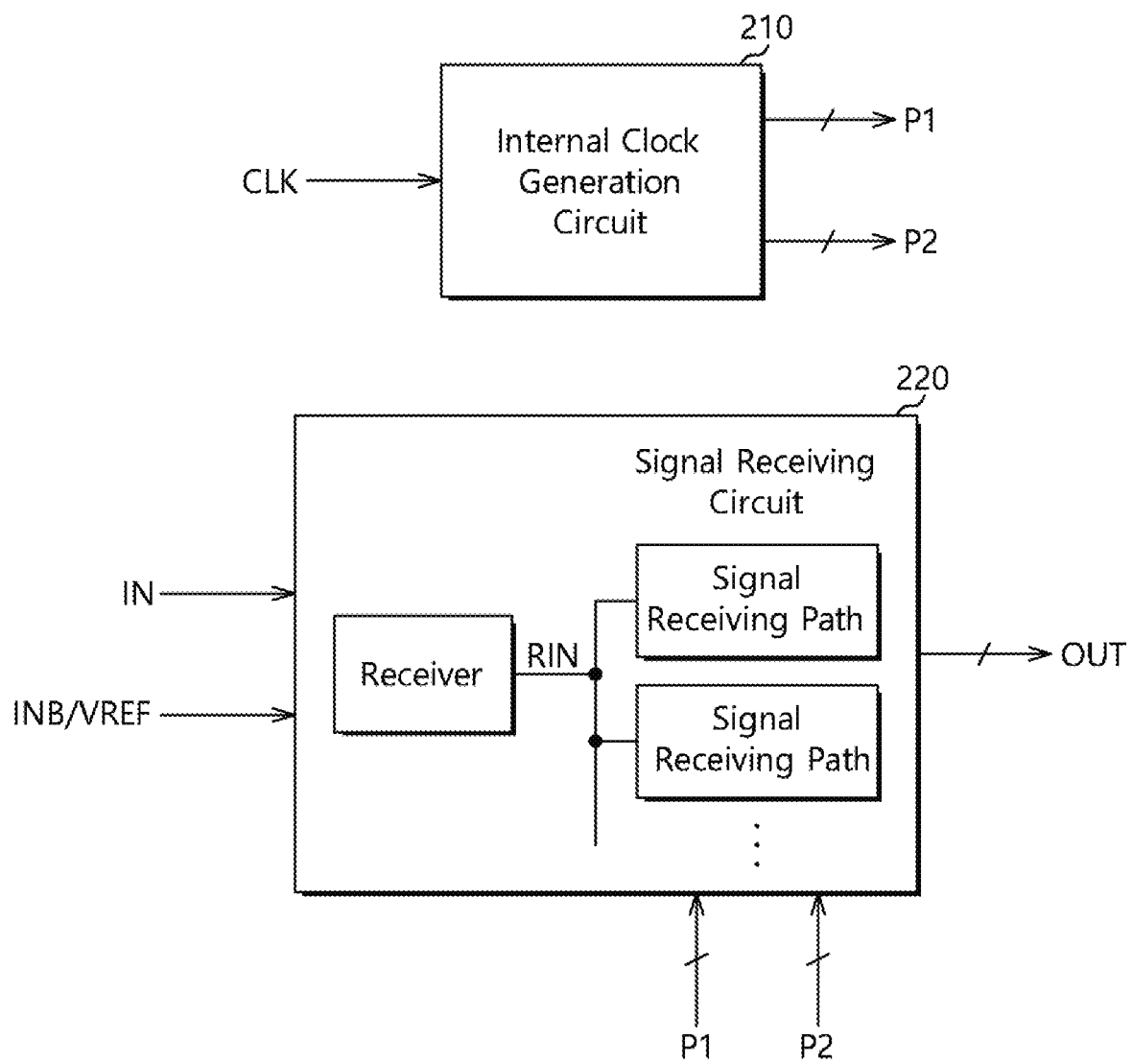
FIG. 2 is a block diagram illustrating a configuration of at least a part of a semiconductor apparatus, in accordance with an embodiment.

FIG. 2 illustrates some components of a semiconductor apparatus 200, in accordance with an embodiment. In FIG. 2, the semiconductor apparatus 200 may include an internal clock generation circuit 210 and a signal receiving circuit 220. The internal clock generation circuit 210 may be applied as the internal clock generation circuit 122 illustrated in FIG. 1, and the signal receiving circuit 220 may be applied as one or more of the signal receiving circuits 114 and 124 illustrated in FIG. 1. The internal clock generation circuit 210 may receive a system clock signal CLK, and may generate a plurality of amplification clock signals P1 and a plurality of sampling clock signals P2 based on the system clock signal CLK. The plurality of amplification clock signals P1 may have a phase difference of unit phase therebetween. The unit phase may mean the phase deference between neighboring amplification clock signals. For example, the unit phase may correspond to the phase of 180 degree of the system clock signal CLK. However, the unit phase may be changed according to a number of the amplification clock signals. The plurality of amplification clock signals P1 may be generated to have a pulse width equal to or less than the duration of an input signal IN received by the signal receiving circuit 220. The plurality of sampling clock signals P2 may have a phase difference of unit phase therebetween. The unit phase may mean the phase deference between neighboring sampling clock signals. For example, the unit phase may correspond to the phase of 180 degree of the system clock signal CLK. However, the unit phase may be changed according to a number of the sampling clock signals. The plurality of sampling clock signals P2 may have a phase that lags behind the plurality of amplification clock signals P1, respectively. The internal clock generation circuit 210 may generate the plurality of amplification clock signals P1 and the plurality of sampling clock signals P2 by dividing the system clock signal CLK. The number of the amplification clock signals P1 and the number of the sampling clock signals P2 may correspond to the number of signal receiving paths included in the signal receiving circuit 220.

The signal receiving circuit 220 may receive the input signal IN, and generate a plurality of output signals OUT. The input signal IN may be a signal corresponding to the synchronization signal SS transmitted through the signal bus 102 illustrated in FIG. 1. The signal receiving circuit 220 may receive the input signal IN, and may generate a received signal RIN. The signal receiving circuit 220 may generate the received signal RIN by differentially amplifying the input signal IN. The signal receiving circuit 220 may include a receiver that generates the received signal RIN by differentially amplifying the input signal IN. The input signal IN may be a differential signal or single ended signal. When the input signal IN is a differential signal, the signal receiving circuit 220 may generate the received signal RIN by differentially amplifying the input signal IN inputted as the differential signal and a complementary signal INB. When the input signal IN is a single ended signal, the signal receiving circuit 220 may generate the received signal RIN by differentially amplifying the input signal IN and a reference voltage VREF. The reference voltage VREF may have a voltage level corresponding to the middle of the swing range of the input signal IN. The input signal IN may be a signal stream including a plurality of consecutive signals.

The signal receiving circuit 220 may generate the plurality of output signals OUT from the received signal RIN in synchronization with the plurality of amplification clock signals P1 and the plurality of sampling clock signals P2. The signal receiving circuit 220 may include a plurality of signal receiving paths. Each of the plurality of signal receiving paths may receive one of the plurality of amplification clock signals P1 and one of the plurality of sampling clock signals P2. The plurality of signal receiving paths may generate the respective output signals OUT from the received signal in synchronization with the received amplification clock signals and the received sampling clock signals. The plurality of signal receiving paths may amplify the received signal RIN in synchronization with the respective amplification clock signals P1, and may generate the plurality of output signals OUT by sampling the amplified signals in synchronization with the respective sampling clock signals P2. When the signal receiving circuit 220 includes four signal receiving paths, the internal clock generation circuit 210 may generate four amplification clock signals and four sampling clock signals.

The signal receiving circuit 220 may perform an equalization operation to remove and/or offset a post-cursor caused by reflection which may occur in the signal transmitting line through which the input signal IN is transmitted. Each of the signal receiving paths may include an equalizer to perform the equalization operation. The equalizer may be a feed forward equalizer, for example. The equalization operations of the signal receiving paths may be performed in synchronization with the respective amplification clock signals P1.

Figure 3A:
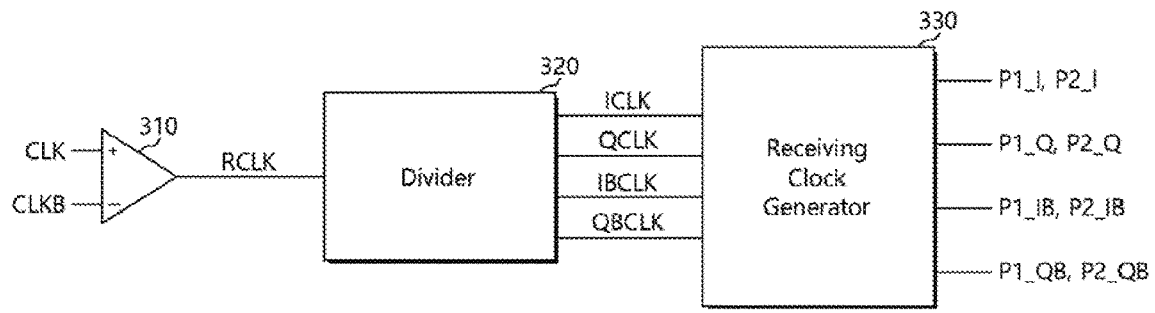
FIG. 3A is a block diagram illustrating a configuration of an internal clock generation circuit illustrated in FIG. 2.

FIG. 3A illustrates a configuration of the internal clock generation circuit 210 illustrated in FIG. 2. In FIG. 3A, the internal clock generation circuit 210 may include a clock receiver 310, a divider 320, and a receiving clock generator 330. The clock receiver 310 may generate a reference clock signal RCLK by differentially amplifying the system clock signal CLK and the complementary signal CLKB. The divider 320 may generate a plurality of divided clock signals by dividing the frequency of the reference clock signal RCLK. For example, the divider 320 may generate four divided clock signals by dividing the frequency of the reference clock signal RCLK by two. The divider 320 may generate a first divided clock signal ICLK, a second divided clock signal QCLK, a third divided clock signal IBCLK, and a fourth divided clock signal QBCLK. The first to fourth divided clock signals ICLK, QCLK, IBCLK, and QBCLK may have an incremental phase difference of 90 degrees between signals.

The receiving clock generator 330 may receive the first to fourth divided clock signals ICLK, QCLK, IBCLK, and QBCLK, and generate the plurality of amplification clock signals and the plurality of sampling clock signals. The receiving clock generator 330 may generate first to fourth amplification clock signals P1_I, P1_Q, P1_IB, and P1_QB and first to fourth sampling clock signals P2_I, P2_Q, P2_IB, and P2_QB based on the first to fourth divided clock signals ICLK, QCLK, IBCLK, and QBCLK. The first to fourth amplification clock signals P1_I, P1_Q, P1_IB, and P1_QB may have a phase difference of the unit phase between neighboring signals. The unit phase may correspond to the phase of 90 degrees of the first to fourth divided clock signals ICLK, QCLK, IBCLK, and QBCLK. The first to fourth sampling clock signals P2_I, P2_Q, P2_IB, and P2_QB may have a phase difference of the unit phase between neighboring signals. The unit phase may correspond to the phase of 90 degrees of the first to fourth divided clock signals ICLK, QCLK, IBCLK, and QBCLK.

Figure 3B:
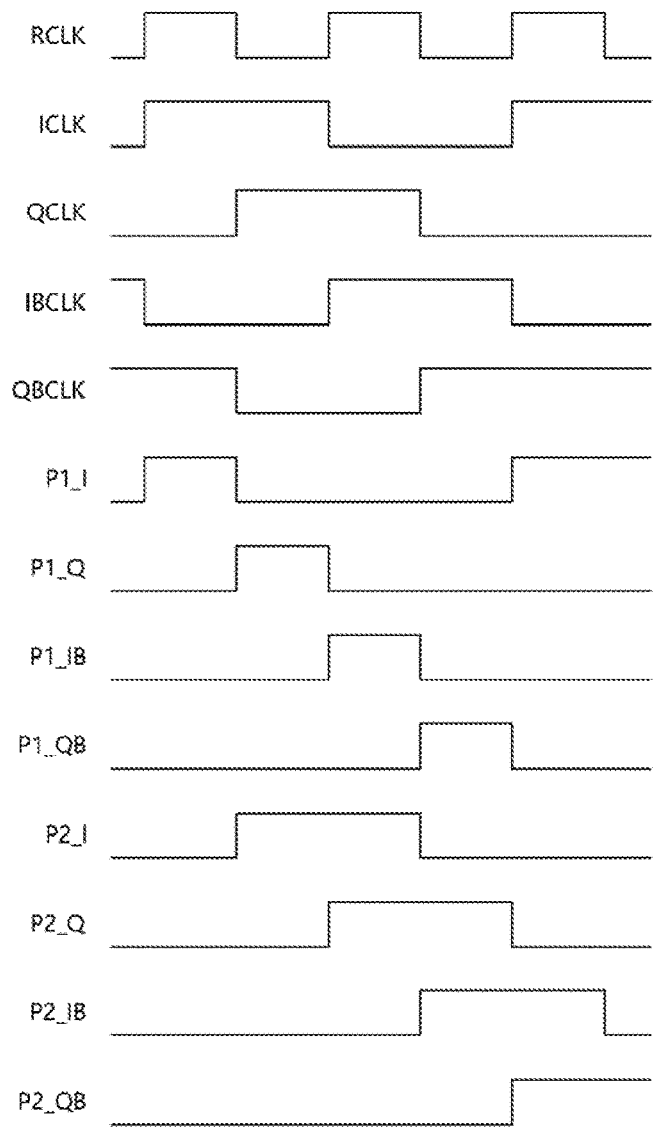
FIG. 3B is a timing diagram illustrating the phases of clock signals illustrated in FIG. 3A.

FIG. 3B is a timing diagram illustrating the phases of the clock signals illustrated in FIG. 3A. The reference clock signal RCLK may have substantially the same frequency and phase as the system clock signal CLK. The first to fourth divided clock signals ICLK, QCLK, IBCLK, and QBCLK may have a frequency corresponding to a half of the frequency of the reference clock signal RCLK and a cycle corresponding to the double of the cycle of the reference clock signal RCLK. The first to fourth divided clock signals ICLK, QCLK, IBCLK, and QBCLK may have a phase difference of 90 degrees therebetween, and the phase difference may correspond to a phase of 180 degrees of the reference clock signal RCLK. The first divided clock signal ICLK may have a phase synchronized with a first rising edge of the reference clock signal RCLK. The second divided clock signal QCLK may have a phase which is synchronized with a first falling edge of the reference clock signal RCLK, and lags behind the first divided clock signal ICLK by 90 degrees. The third divided clock signal IBCLK may have a phase which is synchronized with a second rising edge of the reference clock signal RCLK, and lags behind the second divided clock signal QCLK by 90 degrees. The fourth divided clock signal QBCLK may have a phase which is synchronized with a second falling edge of the reference clock signal RCLK, and lags behind the third divided clock signal IBCLK by 90 degrees.

The first to fourth amplification clock signals P1_I, P1_Q, P1_IB, and P1_QB may have a phase difference of unit phase therebetween, and the unit phase may be 90 degrees. Referring to FIG. 2, the first to fourth amplification clock signals P1_I, P1_Q, P1_IB, and P1_QB may be generated so as to be aligned with edges of the received signal RIN, respectively. The system clock signal CLK may be aligned with edges of the input signal IN or the center of the input signal IN. When the system clock signal CLK is aligned with the edges of the input signal IN, the internal clock generation circuit 210 may generate the first to fourth amplification clock signals P1_I, P1_Q, P1_IB, and P1_QB without substantially changing the phases of the first to fourth divided clock signals ICLK, QCLK, IBCLK, and QBCLK. When the system clock signal CLK is aligned with the center of the input signal IN, the internal clock generation circuit 210 may generate the first to fourth amplification clock signals P1_I, P1_Q, P1_IB, and P1_QB by delaying the phases of the first to fourth divided clock signals ICLK, QCLK, IBCLK, and QBCLK. The first to fourth amplification clock signals P1_I, P1_Q, P1_IB, and P1_QB may be generated to have a pulse width equal to or less than the duration of the system clock signal CLK and/or the reference clock signal RCLK.

The first to fourth sampling clock signals P2_I, P2_Q, P2_IB, and P2_QB may have a phase difference of unit phase therebetween, and the unit phase may be 90 degrees. The first sampling clock signal P2_I may have a phase that lags behind the first amplification clock signal P1_I, and the second sampling clock signal P2_Q may have a phase that lags behind the second amplification clock signal P1_Q. The third sampling clock signal P2_IB may have a phase that lags behind the third amplification clock signal P1_IB, and the fourth sampling clock signal P2_QB may have a phase that lags behind the fourth amplification clock signal P1_QB. The first to fourth sampling clock signals P2_I, P2_Q, P2_IB, and P2_QB may be generated to have a pulse width equal to or less than the pulse width of the first to fourth divided clock signals ICLK, QCLK, IBCLK, and QBCLK.

Figure 4:
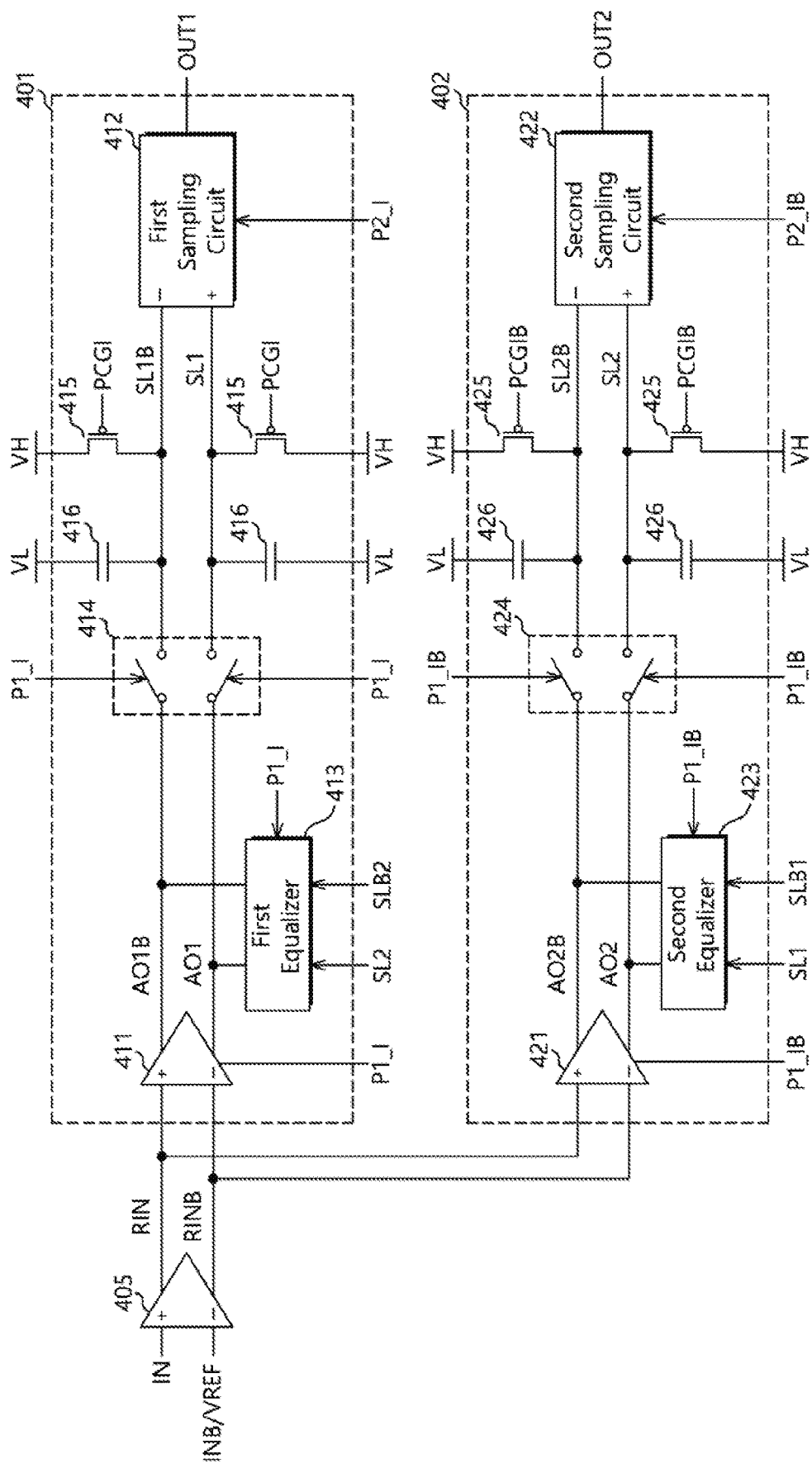
FIG. 4 is a schematic diagram illustrating a configuration of a signal receiving circuit, in accordance with an embodiment.

FIG. 4 illustrates a configuration of a signal receiving circuit 400, in accordance with an embodiment. The signal receiving circuit 400 may include two receiving paths, and may be applied as the signal receiving circuits 114, 124, and 220 illustrated in FIGS. 1 and 2. In FIG. 4, the signal receiving circuit 400 may include a first signal receiving path 401 and a second signal receiving path 402. The first signal receiving path 401 may receive the received signal RIN and output a first output signal OUT1, and the second signal receiving path 402 may receive the received signal RIN and generate a second output signal OUT2. The first signal receiving path 401 may generate the first output signal OUT1 from the received signal RIN based on the first amplification clock signal P1_I and the first sampling clock signal P2_I. The first signal receiving path 401 may generate amplified signals AO1 and AO1B from the received signal RIN in synchronization with the first amplification clock signal P1_I, and generate the first output signal OUT1 from the amplified signals AO1 and AO1B in synchronization with the first sampling clock signal P2_I. The second signal receiving path 402 may generate the second output signal OUT2 from the received signal RIN based on the third amplification clock signal P1_IB and the third sampling clock signal P2_IB. The second signal receiving path 402 may generate amplified signals AO2 and AO2B from the received signal RIN in synchronization with the third amplification clock signal P1_IB, and generate the second output signal OUT2 from the amplified signals AO2 and AO2B in synchronization with the third sampling clock signal P2_IB.

The third amplification clock signal P1_IB may have a phase difference of 180 degrees from the first amplification clock signal P1_I. The third sampling clock signal P2_IB may have a phase difference of 180 degrees from the first sampling clock signal P2_I. The first signal receiving path 401 may perform an equalization operation based on the amplified signals AO2 and AO2B generated by the second signal receiving path 402. The second signal receiving path 402 may perform an equalization operation based on the amplified signals AO1 and AO1B generated by the first signal receiving path 401.

In FIG. 4, the signal receiving circuit 400 may further include a receiver 405. The receiver 405 may receive the input signal IN, and generate the received signal RIN. The input signal IN may be inputted as a differential signal with the complementary signal INB or inputted as a single ended signal. The receiver 405 may generate the received signal RIN by differentially amplifying the input signal pair IN and INB or the input signal IN and the reference voltage VREF. The received signal RIN may be generated as differential signals with a complementary signal RINB.

In FIG. 4, the first signal receiving path 401 may include a first buffer 411, a first sampling circuit 412, and a first equalizer 413. The first buffer 411 may receive the received signals RIN and RINB and the first amplification clock signal P1_I. The first buffer 411 may amplify the received signals RIN and RINB in synchronization with the first amplification clock signal P1_I. The first buffer 411 may generate a first amplified signal AO1 and a second amplified signal AO1B by amplifying the received signals RIN and RINB. The second amplified signal AO1B may be a complementary signal of the first amplified signal AO1. The first sampling circuit 412 may receive the first amplified signal AO1, the second amplified signal AO1B and the first sampling clock signal P2_I. The first sampling circuit 412 may sample the first and second amplified signals AO1 and AO1B in synchronization with the first sampling clock signal P2_I. The first sampling circuit 412 may generate the first output signal OUT1 by sampling the first and second amplified signals AO1 and AO1B. The first equalizer 413 may perform an equalization operation of the first signal receiving path 401 based on the signals generated through the second signal receiving path 402. The first equalizer 413 may perform the equalization operation in synchronization with the first amplification clock signal P1_I.

The second signal receiving path 402 may include a second buffer 421, a second sampling circuit 422, and a second equalizer 423. The second buffer 421 may receive the received signals RIN and RINB and the third amplification clock signal P1_IB. The second buffer 421 may amplify the received signals RIN and RINB in synchronization with the third amplification clock signal P1_IB. The second buffer 421 may generate a third amplified signal AO2 and a fourth amplified signal AO2B by amplifying the received signals RIN and RINB. The fourth amplified signal AO2B may be a complementary signal of the third amplified signal AO2. The second sampling circuit 422 may receive the third amplified signal AO2, the fourth amplified signal AO2B, and the third sampling clock signal P2_IB. The second sampling circuit 422 may sample the third and fourth amplified signals AO2 and AO2B in synchronization with the third sampling clock signal P2_IB. The second sampling circuit 422 may generate the second output signal OUT2 by sampling the third and fourth amplified signals AO2 and AO2B. The second equalizer 423 may perform an equalization operation of the second signal receiving path 402 based on the signals generated through the first signal receiving path 401. The second equalizer 423 may perform the equalization operation in synchronization with the third amplification clock signal P1_IB.

The first equalizer 413 may change the voltage levels of amplified signals generated from currently inputted received signals, based on amplified signals generated from previously inputted received signals. The previously inputted received signals may be the received signals RIN and RINB received by the second buffer 421 when the third amplification clock signal P1_IB is enabled. The amplified signals generated from the previously inputted received signals may be the third and fourth amplified signals AO2 and AO2B which the second buffer 421 generates by amplifying the received signals RIN and RINB in synchronization with the third amplification clock signal P1_IB. The currently inputted received signals may be the received signals RIN and RINB received by the first buffer 411 when the first amplification clock signal P1_I is enabled. The amplified signals generated from the currently inputted received signals may be the first and second amplified signals AO1 and AO1B which the first buffer 411 generates by amplifying the received signals RIN and RINB in synchronization with the first amplification clock signal P1_I. Specifically, the first equalizer 413 may perform an equalization operation based on the third and fourth amplified signals AO2 and AO2B generated through the second signal receiving path 402. The first equalizer 413 may change the voltage levels of the first and second amplified signals AO1 and AO1B based on the third and fourth amplified signals AO2 and AO2B in synchronization with the first amplification clock signal P1_I. The first equalizer 413 may be coupled to signal lines SL2 and SL2B, and receive the third and fourth amplified signals AO2 and AO2B through the signal lines SL2 and SL2B.

The second equalizer 423 may change the voltage levels of the amplified signals generated from the currently inputted received signals, based on the amplified signals generated from the previously inputted received signals. The previously inputted received signals may be the received signals RIN and RINB received by the first buffer 411 when the first amplification clock signal P1_I is enabled. The amplified signals generated from the previously inputted received signals may be the first and second amplified signals AO1 and AO1B which the first buffer 411 generates by amplifying the received signals RIN and RINB in synchronization with the first amplification clock signal P1_I. The currently inputted received signals may be the received signals RIN and RINB received by the second buffer 421 when the third amplification clock signal P1_IB is enabled. The amplified signals generated from the currently inputted received signals may be the third and fourth amplified signals AO2 and AO2B which the second buffer 421 generates by amplifying the received signals RIN and RINB in synchronization with the third amplification clock signal P1_IB. Specifically, the second equalizer 423 may perform an equalization operation based on the first and second amplified signals AO1 and AO1B. The second equalizer 423 may change the voltage levels of the third and fourth amplified signals AO2 and AO2B based on the first and second amplified signals AO1 and AO1B in synchronization with the third amplification clock signal P1_IB. The second equalizer 423 may be coupled to signal lines SL1 and SL1B, and receive the first and second amplified signals AO1 and AO1B through the signal lines SL1 and SL1B.

The conventional signal receiving circuit uses a decision feedback equalization method, and generally performs an equalization operation using an output of a sampling circuit. However, the equalizer in accordance with an embodiment of the present teachings may perform an equalization operation on the amplified signals generated from the currently inputted received signals, based on the amplified signals generated from the previously inputted received signals. Furthermore, the equalizer may perform the equalization operation in synchronization with the amplification clock signal at the time when the amplified signal is generated in synchronization with the amplification clock signal. The signal receiving circuit 400 in accordance with an embodiment may perform the equalization operation at high speed through the feed forward equalization method, without using an output of the sampling circuit. Therefore, it is possible to provide a signal receiving circuit suitable for being used for a semiconductor system which operates at high speed.

In FIG. 4, the first signal receiving path 401 may further include a first synchronization switch 414, a first precharge unit 415, and a first stabilizer 416. The first synchronization switch 414 may receive the first amplification clock signal P1_I. The first synchronization switch 414 may output the first and second amplified signals AO1 and AO1B to the first sampling circuit 412 in synchronization with the first amplification clock signal P1_I. The first synchronization switch 414 may output the first and second amplified signals AO1 and AO1B to the signal lines SL1 and SL1B, respectively, when turned on in synchronization with the first amplification clock signal P1_I. The signal lines SL1 and SL1B may be coupled to the first sampling circuit 412. The first synchronization switch 414 may output the first amplified signal AO1 to the signal line SL1 and output the second amplified signal AO1B to the signal line SL1B, based on the first amplification clock signal P1_I.

The first precharge unit 415 may receive a first precharge signal PCGI. The first precharge unit 415 may precharge the voltage levels of the signal lines SL1 and SL1B based on the first precharge signal PCGI. The first precharge unit 415 may precharge the first and second amplified signals AO1 and AO1B on the signal lines SL1 and SL1B based on the first precharge signal PCGI. The first precharge unit 415 may receive a high voltage VH, and precharge the signal lines SL1 and SL1B with the level of the high voltage VH, based on the first precharge signal PCGI. The first precharge unit 415 may precharge the signal lines SL1 and SL1B after the first sampling circuit 412 generates the first output signal OUT1 by sampling the first and second amplified signals AO1 and AO1B on the signal lines SL1 and SL1B. The first precharge signal PCGI may be a pulse signal which is enabled after the first sampling clock signal P2_I is enabled. The first stabilizer 416 may stabilize the voltage levels of the signal lines SL1 and SL1B. The first stabilizer 416 may include a capacitor that couples the signal lines SL1 and SL1B to a low voltage VL terminal. The low voltage VL may have a lower level than the high voltage VH.

In FIG. 4, the second signal receiving path 402 may further include a second synchronization switch 424, a second precharge unit 425, and a second stabilizer 426. The second synchronization switch 424 may receive the third amplification clock signal P1_IB. The second synchronization switch 424 may output the third and fourth amplified signals AO2 and AO2B to the second sampling circuit 422 in synchronization with the third amplification clock signal P1_IB. The second synchronization switch 424 may output the third and fourth amplified signals AO2 and AO2B to the signal lines SL2 and SL2B, respectively, when turned on in synchronization with the third amplification clock signal P1_IB. The signal lines SL2 and SL2B may be coupled to the second sampling circuit 422. The second synchronization switch 424 may output the third amplified signal AO2 to the signal line SL2 and output the fourth amplified signal AO2B to the signal line SL2B, based on the third amplification clock signal P1_IB.

The second precharge unit 425 may receive a second precharge signal PCGIB. The second precharge unit 425 may precharge the voltage levels of the signal lines SL2 and SL2B based on the second precharge signal PCGIB. The second precharge unit 425 may precharge the third and fourth amplified signals AO2 and AO2B on the signal lines SL2 and SL2B based on the second precharge signal PCGIB. The second precharge unit 425 may receive the high voltage VH, and precharge the signal lines SL2 and SL2B with the level of the high voltage VH, based on the second precharge signal PCGIB. The second precharge unit 425 may precharge the signal lines SL2 and SL2B after the second sampling circuit 422 generates the second output signal OUT2 by sampling the third and fourth amplified signals AO2 and AO2B on the signal lines SL2 and SL2B. The second precharge signal PCGIB may be a pulse signal which is enabled after the third sampling clock signal P2_IB. The second stabilizer 426 may stabilize the voltage levels of the signal lines SL2 and SL2B. The second stabilizer 426 may include a capacitor that couples the signal lines SL2 and SL2B to the low voltage VL terminal.

Figure 5:
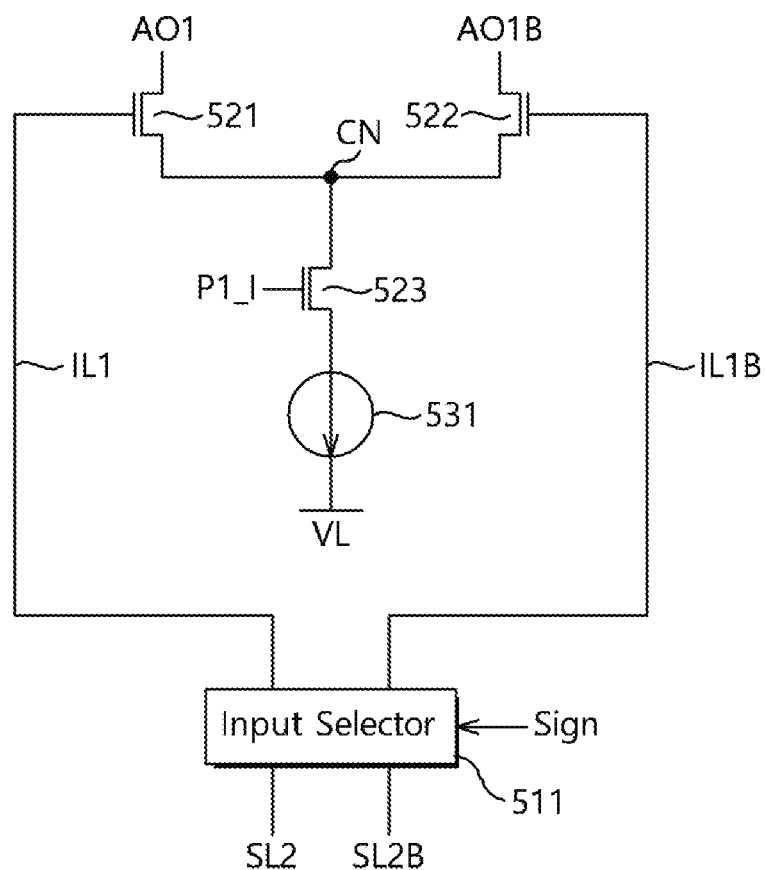
FIG. 5 is a schematic diagram illustrating a configuration of a first equalizer illustrated in FIG. 4.

FIG. 5 illustrates the configuration of the first equalizer 413 illustrated in FIG. 4. The second equalizer 423 illustrated in FIG. 4 may have the same structure as the first equalizer 413, except for input and output signals. In FIG. 5, the first equalizer 413 may include an input selector 511, a first transistor 521, a second transistor 522, a third transistor 523, and a current source 531. The input selector 511 may be coupled to the signal line SL2 and the signal line SL2B. The input selector 511 may receive a control signal Sign. The input selector 511 may couple the signal lines SL2 and SL2B to a first input line IL1 and a second input line IL1B, respectively, based on the control signal Sign. For example, when the control signal Sign is at a first level, the input selector 511 may couple the signal line SL2 to the first input line IL1, and couple the signal line SL2B to the second input line IL1B. On the contrary, when the control signal Sign is at a second level, the input selector 511 may couple the signal line SL2 to the second input line IL1B, and couple the signal line SL2B to the first input line IL1.

Figure 6A:
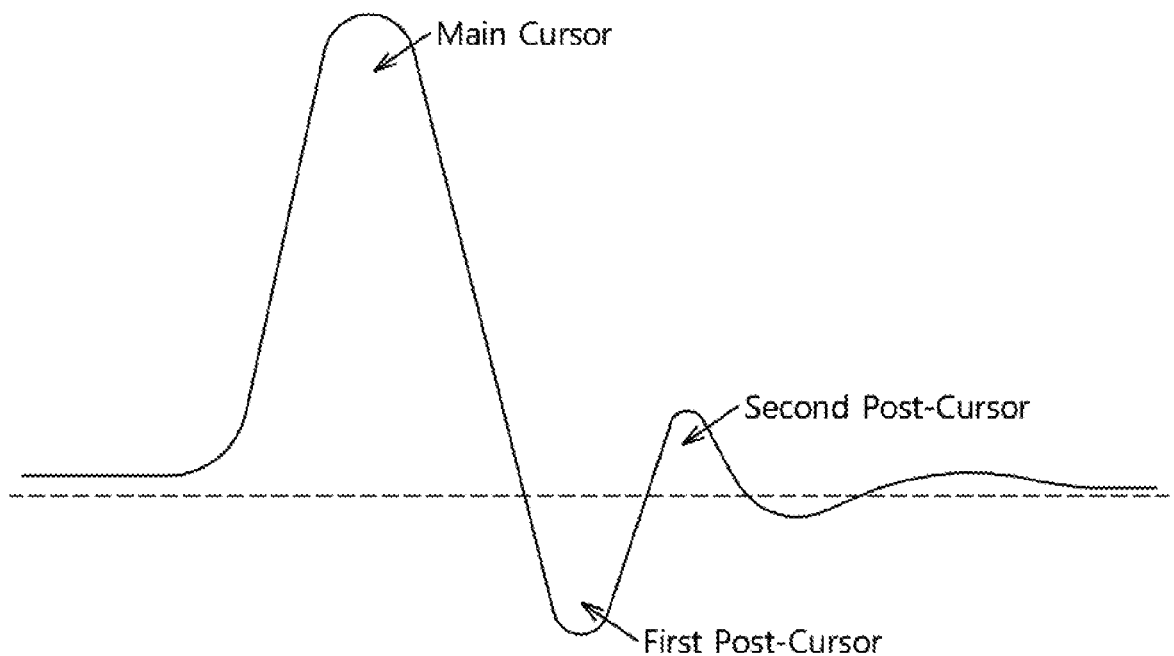
FIGS. 6A and 6B are plots illustrating the waveform of a received signal generated from an input signal according to a channel characteristic of a signal transmitting line.
Figure 6B:
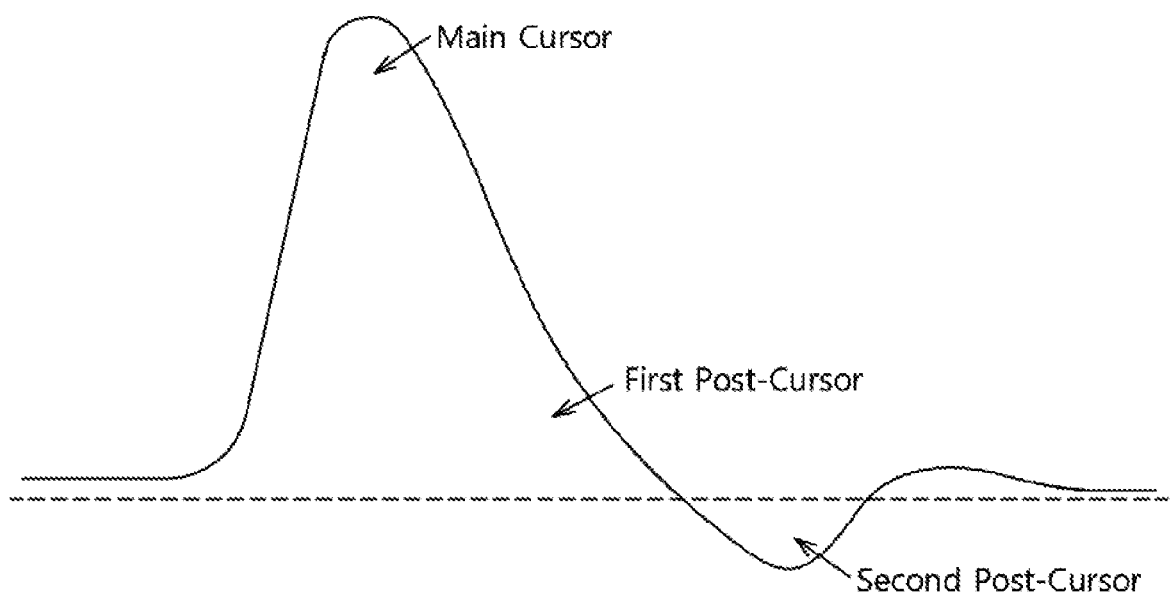

The control signal Sign may have a first or second level depending on the channel characteristic of the signal transmitting line through which the input signal IN is transmitted in FIG. 4. The channel characteristic may include a first characteristic and a second characteristic. FIGS. 6A and 6B illustrate the waveform of a received signal generated from an input signal according to the channel characteristic of the signal transmitting line. As illustrated in FIGS. 6A and 6B, reflection may occur depending on the channel characteristic of the signal transmitting line, and post-cursors may appear in the received signal RIN generated from the input signal IN. When a main cursor of the received signal RIN has a positive value, a first post-cursor may have one of a negative value and a positive value, according to the channel characteristic. As illustrated in FIG. 6A, the first characteristic may indicate the case in which the first post-cursor of the received signal RIN generated from the input signal IN has a negative value. When the channel characteristic is the first characteristic, a main reflection component which needs to be removed and/or offset may be the first post-cursor having a negative value. As illustrated in FIG. 6B, the second characteristic may indicate the case in which the first post-cursor of the received signal RIN generated from the input signal IN has a positive value. When the channel characteristic is the second characteristic, the main reflection component which needs to be removed and/or offset may be the first post-cursor having a positive value.

The first equalizer 413 may perform an equalization operation of removing and/or offsetting the main reflection component of the received signal RIN. When the channel characteristic is the first characteristic, the first equalizer 413 may perform an equalization operation to remove and/or offset the first post-cursor having a negative value. When the channel characteristic the second characteristic, the first equalizer 413 may perform an equalization operation to remove and/or offset the first post-cursor having a positive value. When the channel characteristic is the first characteristic, the control signal Sign may have the first level. When the channel characteristic is the second characteristic, the control signal Sign may have the second level.

The first transistor 521 may be coupled to the first input line IL1 and change the voltage level of the first amplified signal AO1 based on a signal transmitted through the first input line ILL The first transistor 521 may be an N-channel MOS transistor. The first transistor 521 may have a gate coupled to the first input line ILL a drain coupled to the first amplified signal AO1, and a source coupled to a common node CN. The second transistor 522 may be coupled to the second input line IL1B and change the voltage level of the second amplified signal AO1B based on a signal transmitted through the second input line IL1B. The second transistor 522 may be an N-channel MOS transistor. The second transistor 522 may have a gate coupled to the second input line IL1B, a drain coupled to the second amplified signal AO1B, and a source coupled to the common node CN.

The third transistor 523 may form a current path from the common node CN to the low voltage VL terminal based on the first amplification clock signal P1_I. The third transistor 523 may be an N-channel MOS transistor. The third transistor 523 may have a gate configured to receive the first amplification clock signal P1_I, a drain coupled to the common node CN, and a source coupled to the low voltage VL terminal through the current source 531. The current source 531 may control a constant amount of current to flow from the common node CN to the low voltage VL terminal. The current source 531 may be a variable current source, and the amount of current flowing through the current source 531 may be varied.

When the control signal Sign is at the first level, the input selector 511 may couple the signal line SL2 to the first input line ILL and couple the signal line SL2B to the second input line IL1B. Therefore, the first equalizer 413 may change the voltage level of the first amplified signal AO1 based on the third amplified signal AO2 on the signal line SL2, and change the voltage level of the second amplified signal AO1B based on the fourth amplified signal AO2B on the signal line SL2B. When the control signal Sign is at the second level, the input selector 511 may couple the signal line SL2B to the first input line ILL and couple the signal line SL2 to the second input line IL1B. Therefore, the first equalizer 413 may change the voltage level of the second amplified signal AO1B based on the third amplified signal AO2 on the signal line SL2, and change the voltage level of the first amplified signal AO1 based on the fourth amplified signal AO2B on the signal line SL2B.

Figure 7:
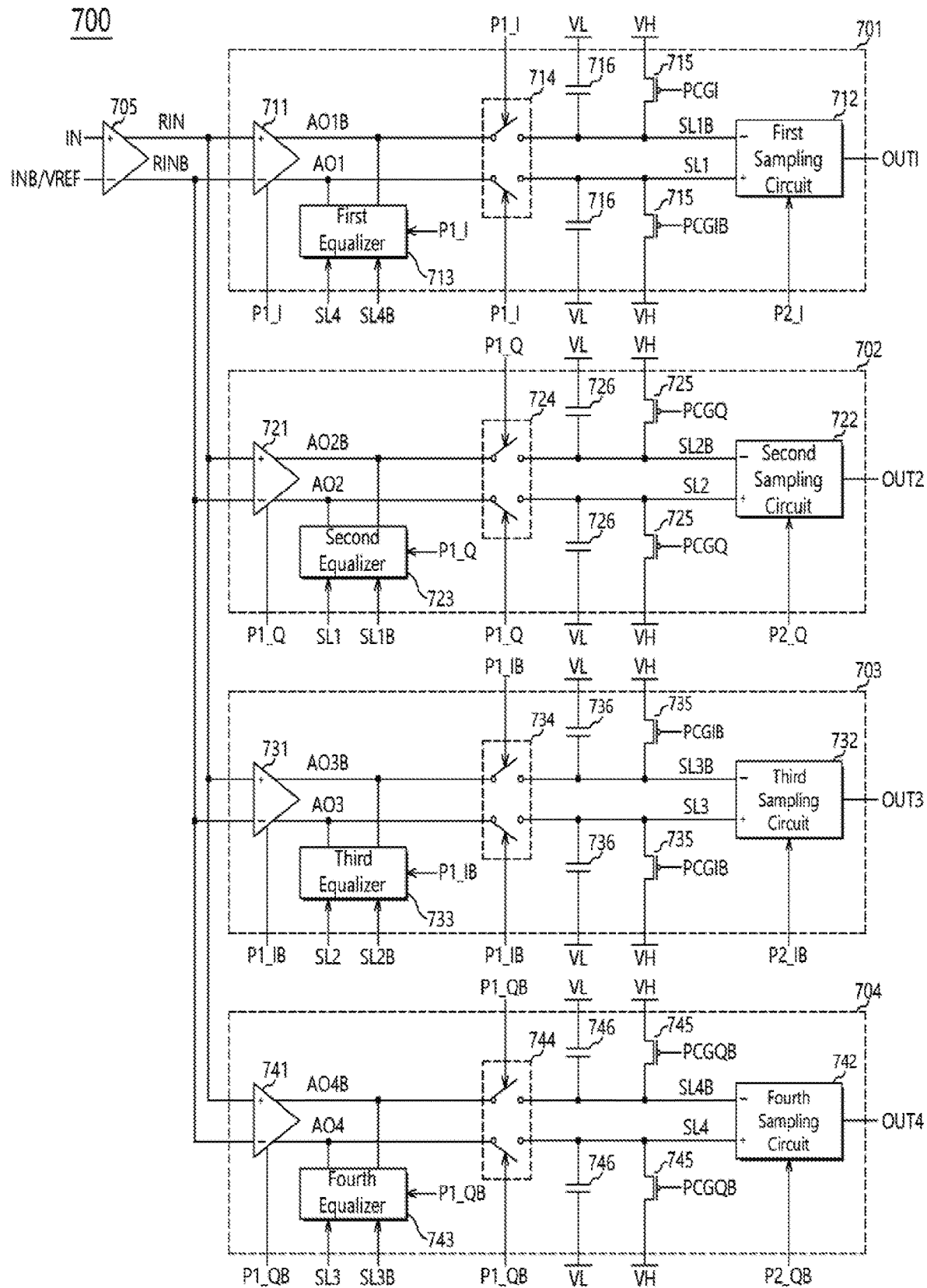
FIG. 7 is a schematic diagram illustrating a configuration of a signal receiving circuit, in accordance with an embodiment.

FIG. 7 illustrates a configuration of a signal receiving circuit 700, in accordance with an embodiment. The signal receiving circuit 700 may be applied as the signal receiving circuits 114, 124 and 220 illustrated in FIGS. 1 and 2. In FIG. 7, the signal receiving circuit 700 may include a receiver 705, a first signal receiving path 701, a second signal receiving path 702, a third signal receiving path 703, and a fourth signal receiving path 704. The receiver 705 may generate the received signals RIN and RINB by differentially amplifying the input signal pair IN and INB or the input signal IN and the reference voltage VREF. The first signal receiving path 701 may receive the received signals RIN and RINB and generate a first output signal OUT1, and the second signal receiving path 702 may receive the received signals RIN and RINB and generate a second output signal OUT2. The third signal receiving path 703 may receive the received signals RIN and RINB and generate a third output signal OUT3, and the fourth signal receiving path 704 may receive the received signals RIN and RINB and generate a fourth output signal OUT4.

The first signal receiving path 701 may generate the first output signal OUT1 from the received signals RIN and RINB based on the first amplification clock signal P1_I and the first sampling clock signal P2_I. The first signal receiving path 701 may generate amplified signals from the received signals RIN and RINB in synchronization with the first amplification clock signal P1_I, and generate the first output signal OUT1 from the amplified signals in synchronization with the first sampling clock signal P2_I. The second signal receiving path 702 may generate the second output signal OUT2 from the received signals RIN and RINB based on the second amplification clock signal P1_Q and the second sampling clock signal P2_Q. The second signal receiving path 702 may generate amplified signals from the received signals RIN and RINB in synchronization with the second amplification clock signal P1_Q, and generate the second output signal OUT2 from the amplified signals in synchronization with the second sampling clock signal P2_Q.

The third signal receiving path 703 may generate the third output signal OUT3 from the received signals RIN and RINB based on the third amplification clock signal P1_IB and the third sampling clock signal P2_IB. The third signal receiving path 703 may generate amplified signals from the received signals RIN and RINB in synchronization with the third amplification clock signal P1_IB, and generate the third output signal OUT3 from the amplified signals in synchronization with the third sampling clock signal P2_IB. The fourth signal receiving path 704 may generate the fourth output signal OUT4 from the received signals RIN and RINB based on the fourth amplification clock signal P1_QB and the fourth sampling clock signal P2_QB. The fourth signal receiving path 704 may generate amplified signals from the received signals RIN and RINB in synchronization with the fourth amplification clock signal P1_QB, and generate the fourth output signal OUT4 from the amplified signals in synchronization with the fourth sampling clock signal P2_QB.

The first signal receiving path 701 may include a first buffer 711, a first sampling circuit 712, and a first equalizer 713. The first buffer 711 may generate a first amplified signal AO1 and a second amplified signal AO1B by amplifying the received signals RIN and RINB in synchronization with the first amplification clock signal P1_I. The first sampling circuit 712 may generate the first output signal OUT1 based on the first and second amplified signals AO1 and AO1B in synchronization with the first sampling clock signal P2_I. The first sampling circuit 712 may generate the first output signal OUT1 by sampling the first and second amplified signals AO1 and AO1B. The first equalizer 713 may perform an equalization operation on the first and second amplified signals AO1 and AO1B based on the signal generated through the fourth signal receiving path 704.

The first signal receiving path 701 may further include a first synchronization switch 714, a first precharge unit 715, and a first stabilizer 716. The first synchronization switch 714 may output the first and second amplified signals AO1 and AO1B to the first sampling circuit 712 in synchronization with the first amplification clock signal P1_I. The first synchronization switch 714 may output the first and second amplified signals AO1 and AO1B to the signal lines SL1 and SL1B, respectively, in synchronization with the first amplification clock signal P1_I, and the first sampling circuit 712 may receive the first and second amplified signals AO1 and AO1B through the signal lines SL1 and SL1B. The first precharge unit 715 may precharge the signal lines SL1 and SL1B based on a first precharge signal PCGI. The first precharge unit 715 may drive the signal lines SL1 and SL1B to the high voltage VH when the first precharge signal PCGI is enabled, and precharge the first and second amplified signals AO1 and AO1B on the signal lines SL1 and SL1B. The first precharge signal PCGI may be enabled after the first sampling clock signal P2_I is enabled. The first stabilizer 716 may include a capacitor coupled to a low voltage VL terminal, and stabilize the voltage levels of the signal lines SL1 and SL1B.

The second signal receiving path 702 may include a second buffer 721, a second sampling circuit 722, and a second equalizer 723. The second buffer 721 may generate a third amplified signal AO2 and a fourth amplified signal AO2B by amplifying the received signals RIN and RINB in synchronization with the second amplification clock signal P1_Q. The second sampling circuit 722 may generate the second output signal OUT2 based on the third and fourth amplified signals AO2 and AO2B in synchronization with the second sampling clock signal P2_Q. The second sampling circuit 722 may generate the second output signal OUT2 by sampling the third and fourth amplified signals AO2 and AO2B. The second equalizer 723 may perform an equalization operation on the third and fourth amplified signals AO2 and AO2B based on the signal generated through the first signal receiving path 701. The second equalizer 723 may receive the second amplification clock signal P1_Q, the first amplified signal AO1, and the second amplified signal AO1B. The second equalizer 723 may change the voltage levels of the third and fourth amplified signals AO2 and AO2B based on the first and second amplified signals AO1 and AO1B in synchronization with the second amplification clock signal P1_Q. The second equalizer 723 may be coupled to the signal lines SL1 and SL1B, and receive the first and second amplified signals AO1 and AO1B.

The second signal receiving path 702 may further include a second synchronization switch 724, a second precharge unit 725, and a second stabilizer 726. The second synchronization switch 724 may output the third and fourth amplified signals AO2 and AO2B to the second sampling circuit 722 in synchronization with the second amplification clock signal P1_Q. The second synchronization switch 724 may output the third and fourth amplified signals AO2 and AO2B to signal lines SL2 and SL2B in synchronization with the second amplification clock signal P1_Q, and the second sampling circuit 722 may receive the third and fourth amplified signals AO2 and AO2B through the signal lines SL2 and SL2B. The second precharge unit 725 may precharge the signal lines SL2 and SL2B based on a second precharge signal PCGQ. The second precharge unit 725 may drive the signal lines SL2 and SL2B to the high voltage VH when the second precharge signal PCGQ is enabled, and precharge the third and fourth amplified signals AO2 and AO2B on the signal lines SL2 and SL2B. The second precharge signal PCGQ may be enabled after the second sampling clock signal P2_Q is enabled. The second stabilizer 726 may include a capacitor coupled to the low voltage VL terminal, and stabilize the voltage levels of the signal lines SL2 and SL2B.

The third signal receiving path 703 may include a third buffer 731, a third sampling circuit 732, and a third equalizer 733. The third buffer 731 may generate a fifth amplified signal AO3 and a sixth amplified signal AO3B by amplifying the received signals RIN and RINB in synchronization with the third amplification clock signal P1_IB. The third sampling circuit 732 may generate the third output signal OUT3 based on the fifth and sixth amplified signals AO3 and AO3B in synchronization with the third sampling clock signal P2_IB. The third sampling circuit 732 may generate the third output signal OUT3 by sampling the fifth and sixth amplified signals AO3 and AO3B. The third equalizer 733 may perform an equalization operation on the fifth and sixth amplified signals AO3 and AO3B based on the signal generated through the second signal receiving path 702. The third equalizer 733 may receive the third amplification clock signal P1_IB, the third amplified signal AO2 and the fourth amplified signal AO2B. The third equalizer 733 may change the voltage levels of the fifth and sixth amplified signals AO3 and AO3B based on the third and fourth amplified signals AO2 and AO2B in synchronization with the third amplification clock signal P1_IB. The third equalizer 733 may be coupled to the signal lines SL2 and SL2B, and receive the third and fourth amplified signals AO2 and AO2B.

The third signal receiving path 703 may further include a third synchronization switch 734, a third precharge unit 735, and a third stabilizer 736. The third synchronization switch 734 may output the fifth and sixth amplified signals AO3 and AO3B to the third sampling circuit 732 in synchronization with the third amplification clock signal P1_IB. The third synchronization switch 734 may output the fifth and sixth amplified signals AO3 and AO3B to signal lines SL3 and SL3B in synchronization with the third amplification clock signal P1_IB, and the third sampling circuit 732 may receive the fifth and sixth amplified signals AO3 and AO3B through the signal lines SL3 and SL3B. The third precharge unit 735 may precharge the signal lines SL3 and SL3B based on a third precharge signal PCGIB. The third precharge unit 735 may drive the signal lines SL3 and SL3B to the high voltage VH when the third precharge signal PCGIB is enabled, and precharge the fifth and sixth amplified signals AO3 and AO3B on the signal lines SL3 and SL3B. The third precharge signal PCGIB may be enabled after the third sampling clock signal P2_IB is enabled. The third stabilizer 736 may include a capacitor coupled to the low voltage VL terminal, and stabilize the voltage levels of the signal lines SL3 and SL3B.

The fourth signal receiving path 704 may include a fourth buffer 741, a fourth sampling circuit 742, and a fourth equalizer 743. The fourth buffer 741 may generate a seventh amplified signal AO4 and an eighth amplified signal AO4B by amplifying the received signals RIN and RINB in synchronization with the fourth amplification clock signal P1_QB. The fourth sampling circuit 742 may generate the fourth output signal OUT4 based on the seventh and eighth amplified signals AO4 and AO4B in synchronization with the fourth sampling clock signal P2_QB. The fourth sampling circuit 742 may generate the fourth output signal OUT4 by sampling the seventh and eighth amplified signals AO4 and AO4B. The fourth equalizer 743 may perform an equalization operation on the seventh and eighth amplified signals AO4 and AO4B based on the signal generated through the third signal receiving path 703. The fourth equalizer 743 may receive the fourth amplification clock signal P1_QB, the fifth amplified signal AO3 and the sixth amplified signal AO3B. The fourth equalizer 743 may change the voltage levels of the seventh and eighth amplified signals AO4 and AO4B based on the fifth and sixth amplified signals AO3 and AO3B in synchronization with the fourth amplification clock signal P1_QB. The fourth equalizer 743 may be coupled to the signal lines SL3 and SL3B, and receive the fifth and sixth amplified signals AO3 and AO3B. The first equalizer 713 may receive the first amplification clock signal P1_I, the seventh amplified signal AO4 and the eighth amplified signal AO4B. The first equalizer 713 may change the voltage levels of the first and second amplified signals AO1 and AO1B based on the seventh and eighth amplified signals AO4 and AO4B in synchronization with the first amplification clock signal P1_I.

The fourth signal receiving path 704 may further include a fourth synchronization switch 744, a fourth precharge unit 745, and a fourth stabilizer 746. The fourth synchronization switch 744 may output the seventh and eighth amplified signals AO4 and AO4B to the fourth sampling circuit 742 in synchronization with the fourth amplification clock signal P1_QB. The fourth synchronization switch 744 may output the seventh and eighth amplified signals AO4 and AO4B to signal lines SL4 and SL4B in synchronization with the fourth amplification clock signal P1_QB, and the fourth sampling circuit 742 may receive the seventh and eighth amplified signals AO4 and AO4B through the signal lines SL4 and SL41B. The fourth precharge unit 745 may precharge the signal lines SL4 and SL4B based on a fourth precharge signal PCGQB. The fourth precharge unit 745 may drive the signal lines SL4 and SL4B to the high voltage VH when the fourth precharge signal PCGQB is enabled, and precharge the seventh and eighth amplified signals AO4 and AO4B on the signal lines SL4 and SL4B. The fourth precharge signal PCGQB may be enabled after the fourth sampling clock signal P2_QB is enabled. The fourth stabilizer 746 may include a capacitor coupled to the low voltage VL terminal, and stabilize the voltage levels of the signal lines SL4 and SL4B.

FIG. 8 is a timing diagram illustrating at least a part of an operation of a signal receiving circuit, in accordance with an embodiment. Referring to FIGS. 1, 7, and 8, the operation of the signal receiving circuit 700 in accordance with an embodiment is described as follows. The case in which the input signal IN includes two consecutive signals, a first input signal IN at a low level, and a second input signal IN at a high level is exemplified. The input signal IN may be inputted to the signal receiving circuit 700 through a signal transmitting line, such as the signal bus 102, in synchronization with the system clock signal CLK. The case in which the system clock signal CLK is aligned with an edge of the input signal IN and data are transmitted at a double data rate is exemplified. The signal receiving circuit 700 may generate the received signal RIN by amplifying the input signal IN, and the received signal RIN may have a low level based on the first input signal IN in a high level period of the system clock signal CLK, and have a high level based on the second input signal IN in a low level period of the system clock signal CLK.

The fourth buffer 741 may generate the seventh and eighth amplified signals AO4 and AO4B by amplifying the received signal RIN in synchronization with the fourth amplification clock signal P1_QB. The seventh amplified signal AO4 may be at a low level, and the eighth amplified signal AO4B may be at a high level. The fourth synchronization switch 744 may output the seventh and eighth amplified signals AO4 and AO4B to the signal lines SL4 and SL4B, the signal line SL4 may change to a low level, and the signal line SL4B may retain a high level. When the fourth sampling clock signal P2_QB is enabled, the fourth sampling circuit 742 may sample the seventh and eighth amplified signals AO4 and AO4B on the signal lines SL4 and SL4B, and generate the fourth output signal OUT4 having a low level. The fourth precharge signal PCGQB may be enabled after the fourth sampling clock signal P2_QB is enabled, and the fourth precharge unit 745 may precharge the voltage levels of the signal lines SL4 and SL4B.

After the fourth amplification clock signal P1_QB is disabled, the first amplification clock signal P1_I may be enabled. The first buffer 711 may generate the first and second amplified signals AO1 and AO1B by amplifying the received signal RIN in synchronization with the first amplification clock signal P1_I. Because the received signal RIN is at a high level, the first amplified signal AO1 may have a high level, and the second amplified signal AO1B may have a low level. The first synchronization switch 714 may output the first and second amplified signals AO1 and AO1B to the signal lines SL1 and SL1B in synchronization with the first amplification clock signal P1_I, the signal line SL1 may retain a high level, and the signal line SL1B may change to a low level. At this time, the first equalizer 713 may receive the seventh and eighth amplified signals AO4 and AO4B through the signal lines SL4 and SL4B in synchronization with the first amplification clock signal P1_I, and change the voltage levels of the first and second amplified signals AO1 and AO1B based on the seventh and eighth amplified signals AO4 and AO4B. Therefore, it is possible to remove and/or offset the main reflection components of the received signal RIN which is the base of the seventh and eighth amplified signals AO4 and AO4B, and to increase the signal integrity of the first and second amplified signals AO1 and AO1B.

When the first sampling clock signal P2_I is enabled, the first sampling circuit 712 may sample the first and second amplified signals AO1 and AO1B on the signal lines SL1 and SL1B, and generate the first output signal OUT1 having a high level. The first precharge signal PCGI may be enabled after the first sampling clock signal P2_I is enabled, and the first precharge unit 715 may precharge the voltage levels of the signal lines SL1 and SL1B.

While a limited number of embodiments have been described above, it will be understood by those skilled in the art that additional embodiments are possible. Accordingly, the signal receiving circuit described herein should not be limited based on the described embodiments.

What is claimed is:

1. A signal receiving circuit comprising:
a first buffer configured to generate a first amplified signal and a second amplified signal by amplifying a received signal which is currently inputted in synchronization with an amplification clock signal;
a sampling circuit configured to generate an output signal by sampling the first and second amplified signals in synchronization with a sampling clock signal; and
an equalizer configured to change voltage levels of the first and second amplified signals based on a third amplified signal and a fourth amplified signal which are generated from the received signal which is previously inputted in synchronization with the amplification clock signal.

2. The signal receiving circuit according to claim 1, wherein the amplification clock signal is aligned with an edge of the received signal and has a pulse width equal to or less than a duration of the received signal.

3. The signal receiving circuit according to claim 1, wherein the sampling clock signal has a phase that lags behind the amplification clock signal.

4. The signal receiving circuit according to claim 1, further comprising a synchronization switch configured to output the first and second amplified signals to the sampling circuit in synchronization with the amplification clock signal.

5. The signal receiving circuit according to claim 4, further comprising a precharge unit configured to reset the first and second amplified signals based on a precharge signal,
wherein the precharge signal is enabled after the sampling clock signal is enabled.

6. The signal receiving circuit according to claim 1, further comprising a second buffer configured to generate the third amplified signal and the fourth amplified signal by amplifying the previously-inputted received signal.

7. The signal receiving circuit according to claim 6, further comprising a receiver configured to receive an input signal transmitted through a signal transmitting line and to generate the received signal.

8. The signal receiving circuit according to claim 7, wherein when the signal transmitting line has a channel characteristic corresponding to a first characteristic, the signal receiving circuit changes the voltage level of the first amplified signal based on the third amplified signal and changes the voltage level of the second amplified signal based on the fourth amplified signal, and
wherein when the signal transmitting line has a channel characteristic corresponding to a second characteristic, the signal receiving circuit changes the voltage level of the first amplified signal based on the fourth amplified signal and changes the voltage level of the second amplified signal based on the third amplified signal.

9. A signal receiving circuit comprising:
a first buffer configured to generate a first amplified signal and a second amplified signal by amplifying a received signal in synchronization with a first amplification clock signal;
a second buffer configured to generate a third amplified signal and a fourth amplified signal by amplifying the received signal in synchronization with a second amplification clock signal;
a first equalizer configured to change voltage levels of the first and second amplified signals based on the third and fourth amplified signals in synchronization with the first amplification clock signal; and
a first sampling circuit configured to generate a first output signal by sampling the first and second amplified signals in synchronization with a first sampling clock signal.

10. The signal receiving circuit according to claim 9, wherein the second amplification clock signal has a phase that leads the first amplification clock signal by a unit phase.

11. The signal receiving circuit according to claim 9, wherein the first and second amplification clock signals are aligned with edges of the received signal, respectively, and have a pulse width equal to or less than duration of the received signal.

12. The signal receiving circuit according to claim 9, wherein the first sampling clock signal has a phase that lags behind the first amplification clock signal.

13. The signal receiving circuit according to claim 9, further comprising a first synchronization switch configured to output the first and second amplified signals to the first sampling circuit in synchronization with the first amplification clock signal.

14. The signal receiving circuit according to claim 13, further comprising a first precharge unit configured to reset the first and second amplified signals based on a first precharge signal,
wherein the first precharge signal is enabled after the first sampling clock signal is enabled.

15. The signal receiving circuit according to claim 9, further comprising a receiver configured to receive an input signal transmitted through a signal transmitting line and to generate the received signal.

16. The signal receiving circuit according to claim 15, wherein, when the input signal is a differential signal, the receiver generates the received signal by differentially amplifying the differential signal, and wherein, when the input signal is a single ended signal, the receiver generates the received signal by differentially amplifying the single ended signal and a reference voltage.

17. The signal receiving circuit according to claim 9, further comprising:

a second equalizer configured to change voltage levels of the third and fourth amplified signals based on the first and second amplified signals in synchronization with the second amplification clock signal; and a second sampling circuit configured to generate a second output signal by sampling the third and fourth amplified signals in synchronization with a second sampling clock signal.

18. The signal receiving circuit according to claim 17, wherein the second sampling clock signal has a phase that lags behind the second amplification clock signal.

19. The signal receiving circuit according to claim 17, further comprising a second synchronization switch configured to output the third and fourth amplified signals to the second sampling circuit in synchronization with the second amplification clock signal.

20. The signal receiving circuit according to claim 19, further comprising a second precharge unit configured to reset the levels of the third and fourth amplified signals based on a second precharge signal, wherein the second precharge signal is enabled after the second sampling clock signal.

\* \* \* \* \*